(12) United States Patent
Tendulkar et al.

(10) Patent No.: US 9,231,203 B1
(45) Date of Patent: Jan. 5, 2016

(54) DOPED NARROW BAND GAP NITRIDES FOR EMBEDDED RESISTORS OF RESISTIVE RANDOM ACCESS MEMORY CELLS

(71) Applicant: Intermolecular Inc., San Jose, CA (US)

(72) Inventors: Mihir Tendulkar, Mountain View, CA (US); Milind Weling, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/565,097

(22) Filed: Dec. 9, 2014

(51) Int. Cl.
| | |
|---|---|
| *H01L 21/06* | (2006.01) |
| *H01L 47/00* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 45/00* | (2006.01) |

(52) U.S. Cl.
CPC .............. *H01L 45/145* (2013.01); *H01L 45/08* (2013.01); *H01L 45/1233* (2013.01); *H01L 45/1616* (2013.01); *H01L 45/1625* (2013.01)

(58) Field of Classification Search
CPC .......................... H01L 45/145; H01L 45/1253
USPC ................. 257/4, 411; 438/102, 103, 104
See application file for complete search history.

(56) References Cited

U.S. PATENT DOCUMENTS

| | | | | |
|---|---|---|---|---|
| 8,686,389 B1* | 4/2014 | Wang | ................... | H01L 45/145 257/2 |
| 2005/0051857 A1* | 3/2005 | Kawahara | ......... | H01L 21/28088 257/411 |
| 2011/0124174 A1* | 5/2011 | Park | ........................ | H01L 45/06 438/382 |
| 2015/0188043 A1* | 7/2015 | Wang | .................. | H01L 45/1253 257/4 |
| 2015/0188044 A1* | 7/2015 | Wang | .................. | H01L 45/1253 257/4 |
| 2015/0188045 A1* | 7/2015 | Wang | ..................... | H01L 45/08 257/4 |
| 2015/0188046 A1* | 7/2015 | Wang | .................... | H01L 45/145 257/4 |

* cited by examiner

*Primary Examiner* — David S Blum

(57) ABSTRACT

Provided are memory cells, such as resistive random access memory (ReRAM) cells, and methods of fabricating such cells. A cell includes an embedded resistor and resistive switching layer connected in series within the embedded resistor. The embedded resistor prevents excessive electrical currents through the resistive switching layer, especially when the resistive switching layer is switched into its low resistive state. The embedded resistor includes a stoichiometric nitride that has a bandgap of less than 2 eV. The embedded resistor is configured to maintain a substantially constant resistance throughout fabrication and operation of the cell, such as annealing the cell and subjecting the cell to forming and switching signals. The stoichiometric nitride may be one of hafnium nitride, zirconium nitride, or titanium nitride. The embedded resistor may also include a dopant, such as tantalum, niobium, vanadium, tungsten, molybdenum, or chromium.

20 Claims, 5 Drawing Sheets

Initial Forming ↓

↕ Operational Switching

DOPED NARROW BAND GAP NITRIDES FOR EMBEDDED RESISTORS OF RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are memory cells, such as resistive random access memory (ReRAM) cells, and methods of fabricating such cells. A memory cell includes a resistive switching layer, electrodes and a steering element connected in series with the embedded resistor. The embedded resistor prevents excessive electrical currents through the resistive switching layer, especially when the resistive switching layer is formed or is switched between its resistive states. The embedded resistor operates effectively as a voltage divider. The embedded resistor includes a stoichiometric nitride that has a bandgap of less than about 2 eV. The stoichiometric nitride may be one of hafnium nitride, zirconium nitride, or titanium nitride. The embedded resistor may also include a dopant, such as tantalum, niobium, vanadium, tungsten, molybdenum, or chromium. The embedded resistor or, more specifically, the doped stoichiometric nitride may be configured to maintain a substantially constant resistance throughout fabrication and operation of the cell, such as annealing the cell and subjecting the cell to forming and switching signals. For example, the resistance may change by less than 200% when a switching signal is applied to the memory cell.

In some embodiments, a memory cell includes a first layer operable as a first electrode, a second layer operable to reversibly switch between two resistive states when a switching signal is applied to the memory cell, a third layer connected in series with the second layer within the memory cell, and a fourth layer operable as a second electrode. The second layer may be referred to as a resistive switching layer, while the third layer may be referred to as an embedded resistor. The second layer and the third layer are disposed between the first layer and the fourth layer. The third layer has a resistivity of between 0.1 Ohm-cm and 40 Ohm-cm when a reading signal is applied to the memory cell. It should be noted that the reading signal is designed to check the resistance of the memory cell in order to determine the resistive state of the second layer without changing the resistive state of the second layer. On the other hand, the switching signal is designed to change the resistive state of the second layer and, as such, the overall resistance of the memory cell. These signals are further described below with reference to FIGS. 1B-1C and 2A and 2B.

The third layer includes a stoichiometric nitride of a first metal. The bandgap of this stoichiometric nitride may be less than 2 eV. In some embodiments, the stoichiometric nitride of the third layer is represented by a stoichiometric formula $M_xN_y$, in which M represents the first metal and N represents nitrogen, and x and y determine the stoichiometry. The third layer is doped with a second metal that is different from the first metal. The second metal may also be present in the form of a nitride in the third layer. For example, the second metal may form a non-stoichiometric nitride of the second metal. This non-stoichiometric nitride may form a percolating network within a matrix of the stoichiometric oxide of the first metal within the third layer.

In some embodiments, the first metal is one of hafnium, zirconium, or titanium. As such, the stoichiometric nitride may be one of $Hf_3N_4$, $Zr_3N_4$, $Ti_3N_4$, or various combinations thereof. The second metal may be one of tantalum, niobium, vanadium, tungsten, molybdenum, or chromium.

In some embodiments, the third layer is configured to change its resistivity by less than 200% and as low as 100% when the switching signal is applied to the memory cell. The thickness of the third layer is between about 20 Angstroms and 300 Angstroms.

In some embodiments, the third layer further comprises an additional stoichiometric nitride. The bandgap of the additional stoichiometric nitride may be also less than 2 eV. For example, various combinations of $Hf_3N_4$, $Zr_3N_4$, and $Ti_3N_4$ may be used for the third layer. In some embodiments, the bandgap of the additional stoichiometric nitride may be greater than 2 eV. For example, the additional stoichiometric nitride may be $Si_3N_4$. $Si_3N_4$ may be combined with one or more of $Hf_3N_4$, $Zr_3N_4$, and $Ti_3N_4$ to form the third layer.

In some embodiments, the memory cell also includes a fifth layer disposed between the second layer and the third layer. The fifth layer may be operable as an intermediate electrode to form an interface with the second layer. In some embodiments, the fifth layer may be used to reduce diffusion of materials between the first layer and second layer.

In some embodiments, the stoichiometric nitride is formed by atomic layer deposition or plasma enhanced atomic layer deposition. Alternatively, the stoichiometric nitride is formed by physical vapor deposition. As further described below, the deposition technique may influence composition and/or morphology of the third layer resulting in different resistance stability characteristics. In some embodiments, the material of the third layer may be amorphous. The material of the third layer may be configured to withstand a temperature of up to 750° C. for up to 60 seconds while remaining substantially amorphous. Without being restricted to any particular theory, it is believed that doping may help the third layer to remain amorphous.

In some embodiments, a method of fabricating a memory cell involves forming a first layer operable as a first electrode, forming a second layer over the first layer, forming a third layer over the second layer, and forming a fourth layer over the third layer. The second layer is operable to reversibly switch between two resistive states when a switching signal is applied to the memory cell. The fourth layer is operable as a second electrode. The third has a resistivity of between 1 Ohm-cm and 4 Ohm-cm when a reading signal is applied to the memory cells. The third layer includes a stoichiometric nitride of a first metal represented by a stoichiometric formula $M_xN_y$, in which M represents the first metal and N represents nitrogen and x and y determine the stoichiometry. The bandgap of the stoichiometric nitride of the first metal is less than 2 eV. The third layer is doped with a second metal different from the first metal. The third layer may be formed using physical vapor deposition, such as reactive sputtering, or atomic layer deposition, such as nano-lamination. A dopant may be introduced while the stoichiometric nitride of the first metal is formed or after the stoichiometric nitride is formed.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
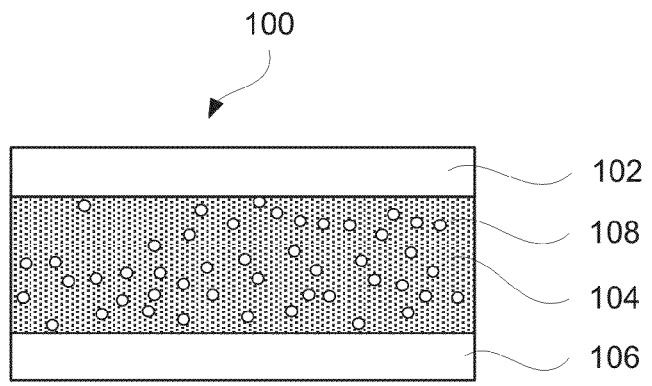
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when a switching signal, e.g., a switching voltage is applied to the insulator layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures. The resistive state of the ReRAM cell is checked with a reading pulse, which may a reading voltage applied to the insulator layer or, more generally, to the ReRAM cell. The reading voltage is generally much smaller than the switching voltage to avoid accidental change in the resistance of the ReRAM cell during the reading operation. In addition to the voltage magnitude, the reading and switching pluses may be characterized by voltage polarities, pulse duration, and other like characteristics.

The switching signal may be applied as one voltage pulse or as a series of pulses, with each switching voltage pulse followed by a reading voltage pulse in order to check the current resistive state of the cell. The switching pulse may be repeated if the desired resistive state is not reached. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that needs to be well controlled to prevent over-programming, e.g., going beyond a desired resistive state. For example, when the resistive switching layer is switched from its high resistive state to its low resistive state, the drop in resistance may cause an excessive current through the resistive switching layer and overheating of the resistive switching layer and other components. If that happens, the memory state may become inoperable. As such, switching signals are applied as very short pulses, e.g., about 50 nanoseconds in duration. However, even during a relatively short switching pulse, the change in resistance may be sufficiently large resulting in large switching currents, current spiking, over-programming and insufficient endurance (maximum number of possible cycles). In some embodiments, the difference in resistances between the low and high resistive states may be more than an order of magnitude in order to have a detectable change in the resistive state. To address this potential problem, an embedded resistor may be connected in series with the resistive switching layer. The embedded resistor effectively functions as a voltage divider within the ReRAM cell and maintains substantially constant resistance throughout the entire operation of the cell thereby prevent excessive current spiking. For example, the embedded resistor may change its resistance by less than 200% when the switching signal is applied to the memory cell in comparison to the resistance of the embedded resistor when the reading signal is applied to the memory cell. In some examples, this increase may be less than 100%. In either case, the change in resistance of the embedded resistor is less that the change in resistance of the resistive switching layer when the switching signal is applied to the memory cell. In general, the resistance of the embedded resistor may change with voltage applied across the embedded resistor, but this resistance does not jump one level to another, similar to the resistive switching layer, when at any operating voltage. In other words, the embedded resistor may have only one resistance at any voltage and therefore cannot have different resistive states, unlike the resistive switching layer. The resistivity of the embedded resistor may be between about 0.1-40 Ohm-cm or, more specifically, 1-4 Ohm-cm when a reading signal is applied to the memory cell. As such, embedded resistors are clearly distinguishable from signal lines and electrodes (which have substantially lower resistivities, such as less than 0.001 Ohm-cm), resistive switching layers (which change their resistances), and other components.

Embedded resistors may be subjected to some design and fabrication constraints. For example, the thickness of embedded resistors may be between about 10 Angstroms to about 500 Angstroms or, more specifically, between 20 Angstroms to about 100 Angstroms. As further described below, the thickness of the embedded resistor may impact its resistance stability characteristics. Furthermore, these thickness values place significant constraints on fabrication options and even materials selections. Not many materials can be formed into such thin layers and achieved the desired resistivity as well thermal and electrical stability characteristics. For example, diode activation may subject the entire memory cell including its embedded resistor to a temperature of up to 750° C. or more for up to about 1 minute or more. The embedded resistor material should not exhibit any significant loss in its resistivity or compromise the remaining materials in the stack by, for example, displacing some of its components into adjacent layers. The change in resistivity after being subject to the diode activation should be less than an order of magnitude.

Provided are memory cells, such as ReRAM cells, having embedded resistors formed from stoichiometric nitrides. A stoichiometric nitride used for this application has a bandgap of less than 2 eV. The stoichiometric nitride may be configured to maintain a substantially constant resistivity throughout fabrication and operation of the cell, such as annealing the cell and subjecting the cell to forming and switching signals. For example, the resistance should not change by more than 200% when a switching signal is applied to the memory cell. The stoichiometric nitride may be one of hafnium nitride, zirconium nitride, or titanium nitride. The embedded resistor may also include a dopant, such as tantalum, niobium, vanadium, tungsten, molybdenum, or chromium.

A conventional embedded resistor may be formed from silicon nitride combined with a metal nitride, such as hafnium nitride, zirconium nitride, titanium nitride or tantalum nitride. Without being restricted to any particular theory, the conduction mechanism in such an embedded resistor is believed to involve the metal nitride forming conducting grains within the insulating silicon nitride matrix. When a higher potential is applied to this embedded resistor (e.g., when a ReRAM cell is subjected to switching signals), the metal nitride grains couple forming agglomerates, which electrons can use for tunneling through the embedded resistor. This tunneling is impacted by the grain size, grain spacing, and bandgap of the insulating matrix. As such, a lower bandgap material may permit easier tunneling between grains than, for example, when silicon nitride is used. The easier tunneling, in turn, makes the resulting I-V curve more linear. In other words, the resistance of the embedded resistor becomes more stable. The linearity/resistance stability is desirable for embedded resistor applications for reasons described above, such as preventing excessive current spiking and over-programming. For example, it would be detrimental for the resistance of the embedded resistor to decrease significantly when the resistive switching layer switches from its high resistance state to its low resistance state.

For purposes of this disclosure, a narrow band nitride is referred to any nitride having a bandgap of less than about 2 eV. Some examples of narrow band nitrides include $Hf_3N_4$ (Eg=1.8 eV), $Zr_3N_4$ (Eg=1.1 eV), and $Ti_3N_4$ (Eg=0.6 eV). It should be noted that the bandgap and resistivity depends on the stoichiometry of the nitride. For example, hafnium nitride may be deposited as HfN rather than as $Hf_3N_4$, and the HfN form is metallic and is not usable for embedded resistor applications. The embedded resistor can be doped with one or more of tantalum, niobium, vanadium, tungsten, molybdenum, or chromium. These dopants form XN grains (where X is one of the listed dopants), which form a percolating network within these semiconducting matrices. The dopant may also help maintaining the materials of the embedded resistor in amorphous state.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages, i.e., switching signals. The resistive state may be checked by applying a reading signal. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials.

As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming signal and later a switching signal. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
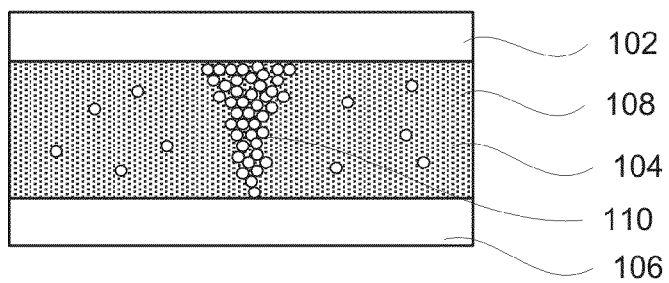
FIGS. 1B and 1C illustrate schematic representations of the ReRAM cell in its low resistive state (LRS) and high resistive state (HRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
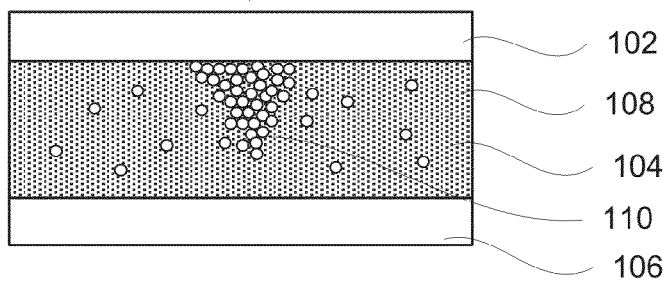

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
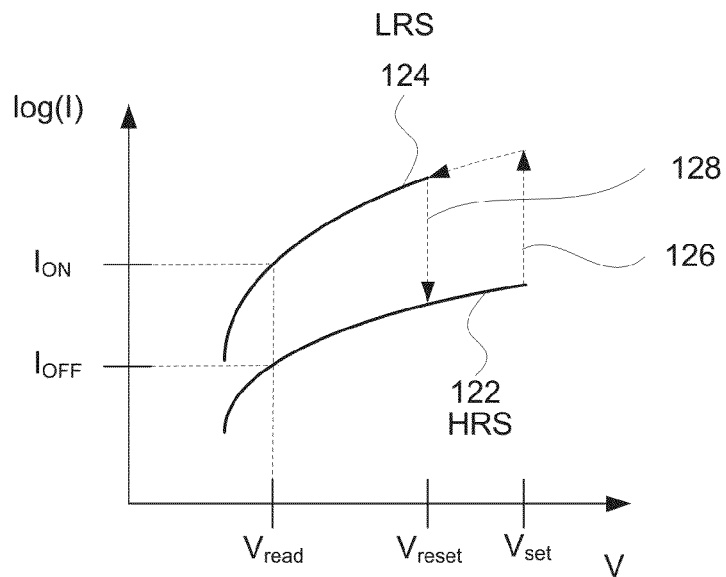
FIG. 2A illustrates a plot of a current passing through a unipolar ReRAM cell as a function of a voltage applied to the ReRAM cell, in accordance with some embodiments.
Figure 2B:
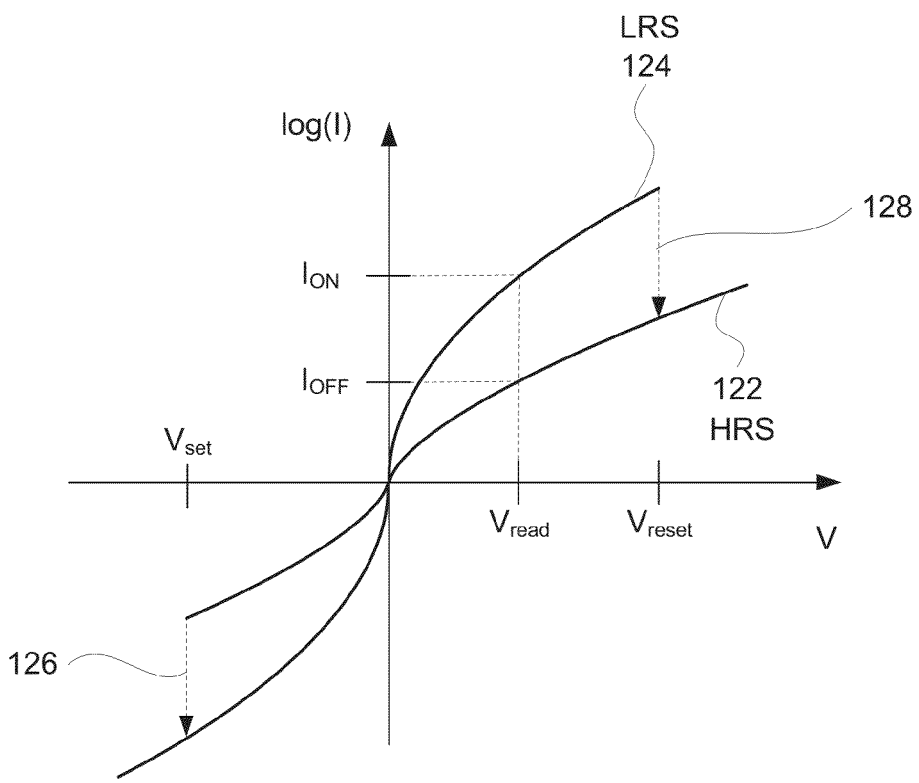
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of ReRAM Cells

Figure 3A:
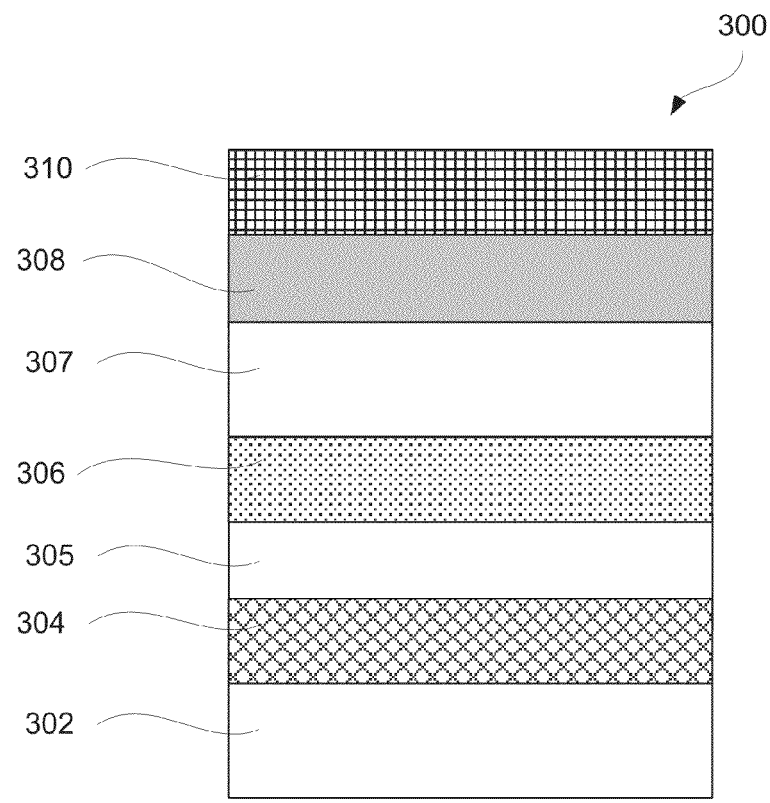
FIGS. 3A and 3B illustrate schematic representations of two ReRAM cells, each having an embedded resistor and resistive switching layer disposed between two electrodes, in accordance with some embodiments.
Figure 3B:
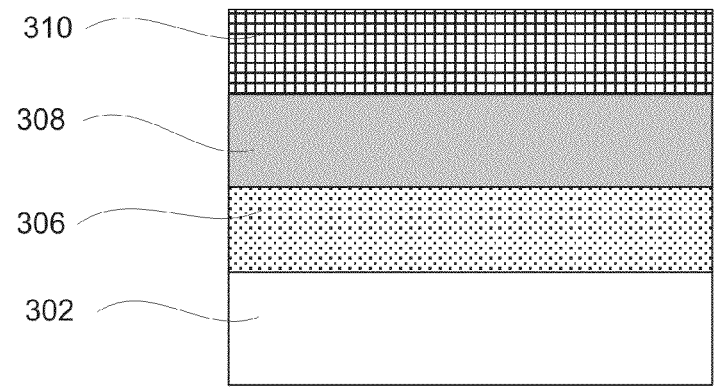

FIG. 3A illustrates a schematic representation of ReRAM cell 300, in accordance with some embodiments. ReRAM cell 300 may include first electrode 302, current steering element 304, resistive switching layer 306, intermediate layers 305 and 307, embedded resistor 308, and second electrode 310. First electrode 302 may be referred to as a first layer, resistive switching layer 306 may be referred to as a second layer, embedded resistor 308 may be referred to as a third layer, and second electrode 310 may be referred to as a fourth layer. Intermediate layer 307, if one is present, may be referred to as a fifth layer. Numbering, e.g., "first," "second," and so on, is used herein only for differentiating reasons and does not imply any deposition order or spatial orientation of any layers unless specifically noted. In some embodiments, ReRAM cell 300 has more or fewer layers. For example, intermediate layer 307 may be disposed between resistive switching layer 306 and embedded resistor 308 as shown in FIG. 3A. Intermediate layer 307 may be used to block diffusion of materials between resistive switching layer 306 and embedded resistor 308. Alternatively, embedded resistor 308 may directly interface resistive switching layer 306 as shown in FIG. 3B and an intermediate layer may not be present in this example. Intermediate layer 305 may be operable as an electrode and form an operable interface with resistive switching layer 306. In another example, current steering element 304 may be omitted from ReRAM cell 300 as, for example, shown in FIG. 3B. In some embodiments, the electrodes may be sufficiently conductive and may be used as signal lines extending between and interconnecting multiple ReRAM cells or read/write signal access lines as further described below with reference to FIGS. 5A and 5B. Alternatively, signal lines and electrodes may be separate components.

Current steering element 304, if one is present, may be an intervening electrical component, such as a p-n junction diode, p-i-n diode, transistor, or other similar device disposed between first electrode 302 and second electrode 310 or between the first signal line and second signal line. In general, current steering element 304 is connected in series with resistive switching layer 306. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride.

Resistive switching layer 306 can be fabricated from a dielectric material, such as a metal oxide material or other similar material that can be switched between two or more stable resistive states. Some examples of these materials include silicon oxide, hafnium oxide, titanium oxide, and zirconium oxide. In some embodiments, resistive switching layer 306 is fabricated from silicon oxide. Furthermore, resistive switching layer 306 may include a combination of two or more oxides, such as a combination of silicon oxide and hafnium oxide. In some embodiments, one or more oxides used for resistive switching layer 306 may be non-stoichiometric oxides.

Resistive switching layer 306 may have a thickness of between about 1 nm to about 100 nm, such as between about 2 nm and 20 nm or, more specifically, between about 5 nm and 10 nm. For example, resistive switching layer 306 may have a thickness of about 10 nm. Thinner resistive switching layers may be deposited using ALD, while thicker resistive switching layers may be deposited using may be deposited using ALD or physical vapor deposition (PVD) or, in some embodiments, chemical vapor deposition (CVD).

Embedded resistor 308 may have a resistivity of between 1 Ohm-cm and 4 Ohm-cm when, for example, a reading signal is applied to ReRAM cell 300. As further described below, the resistivity of the embedded resistor may be different when another signal, e.g., a switching signal is applied to embedded resistor 308. This resistivity range distinguishes embedded resistor 308 from other components of ReRAM cell 300, such as first electrode 302 and second electrode 310.

Embedded resistor 308 may include a stoichiometric nitride of a first metal or, more generally, a substantially stoichiometric nitride of the first metal. The deviation from a theoretical stoichiometric nitride may be less than 2% atomic. For example, the stoichiometric nitride of the first metal may be represented by the formula stoichiometric formula $M_XN_Y$, in which M represents the first metal, N represents nitrogen, and the ratio of X/Y is between 0.735 and 0.765 or, more specifically, between 0.74 and 0.76. For simplicity, the first metal may be represented by the formula stoichiometric formula $M_3N_4$ in the rest of this description. However, one having ordinary skills in the art would understand that some deviation from this stoichiometric formula is accepted in accordance with the "substantially stoichiometric" definition presented above.

The bandgap of the stoichiometric nitride of the first metal may be less than 2 eV or even less than 1.5 eV. Some examples of narrow band nitrides include $Hf_3N_4$ (Eg=1.8 eV), $Zr_3N_4$ (Eg=1.1 eV), and $Ti_3N_4$ (Eg=0.6 eV).

Embedded resistor 308 may be doped with a second metal that is different from the first metal. The second metal may also be present in a form a nitride in embedded resistor 308. For example, the second metal may form a non-stoichiometric nitride of the second metal. In regard to the second metal forming a nitride, the deviation from a theoretical stoichiometric nitride may be greater than 5% atomic. This non-stoichiometric nitride may form a percolating network within a matrix of the stoichiometric oxide of the first metal within embedded resistor 308.

In some embodiments, the first metal is one of hafnium, zirconium, or titanium. As such, the stoichiometric nitride formed by the first metal may be one of $Hf_3N_4$, $Zr_3N_4$, $Ti_3N_4$, $Ta_3N_4$, or various combinations thereof. As described above, these nitrides have a lower bandgap than for example silicon nitride used for conventional embedded resistors. Furthermore, these nitrides have a better resistance stability than, for example, silicon nitride. For purposes of this disclosure, the resistance stability is defined as a change in resistance when a higher potential than a reference potential is applied to the structure. The reference potential may be a potential close to 0V or a reading signal potential. A higher potential may be a switching signal potential. A table below shows resistance value ratios ($R_1/R_2$) when a voltage changes from 0.5V (corresponding to $R_1$) to 4V (corresponding to $R_2$) for several different samples. For various ReRAM cells, 0.5V is representative of a typical reading signal potential, while 4V is representative of a typical switching signal potential.

TABLE

| Material | Deposition | Thickness | Avg Ratio ($R_1/R_2$) |
| --- | --- | --- | --- |
| $Hf_3N_4$ | ALD | 150 Angstroms | 2.2 |
| $Hf_3N_4$ | PVD | 150 Angstroms | 3.5 |
| $Hf_3N_4$ | PVD | 500 Angstroms | 2.1 |
| $Ta_3N_4$ | ALD | 150 Angstroms | 1.2 |
| $Ta_3N_4$ | PVD | 150 Angstroms | 0.7 |
| $Ta_3N_4$ | PVD | 500 Angstroms | 1.0 |

Composition of embedded resistor 308 has a significant impact on the resistance stability. Other factors include the thickness of embedded resistor 308 and deposition techniques used to form embedded resistor 308 as shown in the table above. In some embodiments, embedded resistor 308 is configured to change its resistivity by less than 200% (i.e., $R_1/R_2<3$) when the switching signal is applied to the memory cell or even by less than 100% (i.e., $R_1/R_2<2$) in comparison, for example, to applying a reading signal. The thickness of the third layer is between about 10 Angstroms and 500 Angstroms or, more specifically, between about 20 Angstroms and 100 Angstroms.

The second metal used to dope embedded resistor 308 may be one of tantalum, niobium, vanadium, tungsten, molybdenum, or chromium. In some embodiments, embedded resistor 308 also includes an additional stoichiometric nitride that is different from the nitride formed by the first metal or the nitride formed by the second metal. The bandgap of this additional stoichiometric nitride may be also less than 2 eV. For example, various combinations of $Hf_3N_4$, $Zr_3N_4$, $Ti_3N_4$, and $Ta_3N_4$ may be used for embedded resistor 308. It should be noted that this combination is further doped by the second metal. Alternatively, the bandgap of the additional stoichiometric nitride may be greater than 2 eV. For example, the additional stoichiometric nitride may be $Si_3N_4$. Specifically, $Si_3N_4$ may be combined with one or more of $Hf_3N_4$, $Zr_3N_4$, $Ti_3N_4$, and $Ta_3N_4$ to form the third layer.

The material forming embedded resistor 308 may be amorphous. Furthermore, the material forming embedded resistor 308 may be configured to withstand a temperature of up to 750° C. for up to 60 seconds while remaining substantially amorphous.

First electrode 302 and/or second electrode 310 may be fabricated from a conductive material that has a desirable conductivity and work function, such as p-type polysilicon, n-type polysilicon, transition metals, transition metal alloys, transition metal nitrides, or transition metal carbides. For example, first electrode 302 and/or second electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, first electrode 302 and/or second electrode 310 may be formed from titanium, tantalum, or aluminum. First electrode 302 and/or second electrode 310 may be between about 5 nm and about 500 nm thick or, more specifically, between about 10 nm and about 100 nm thick.

Processing Examples

Figure 4:
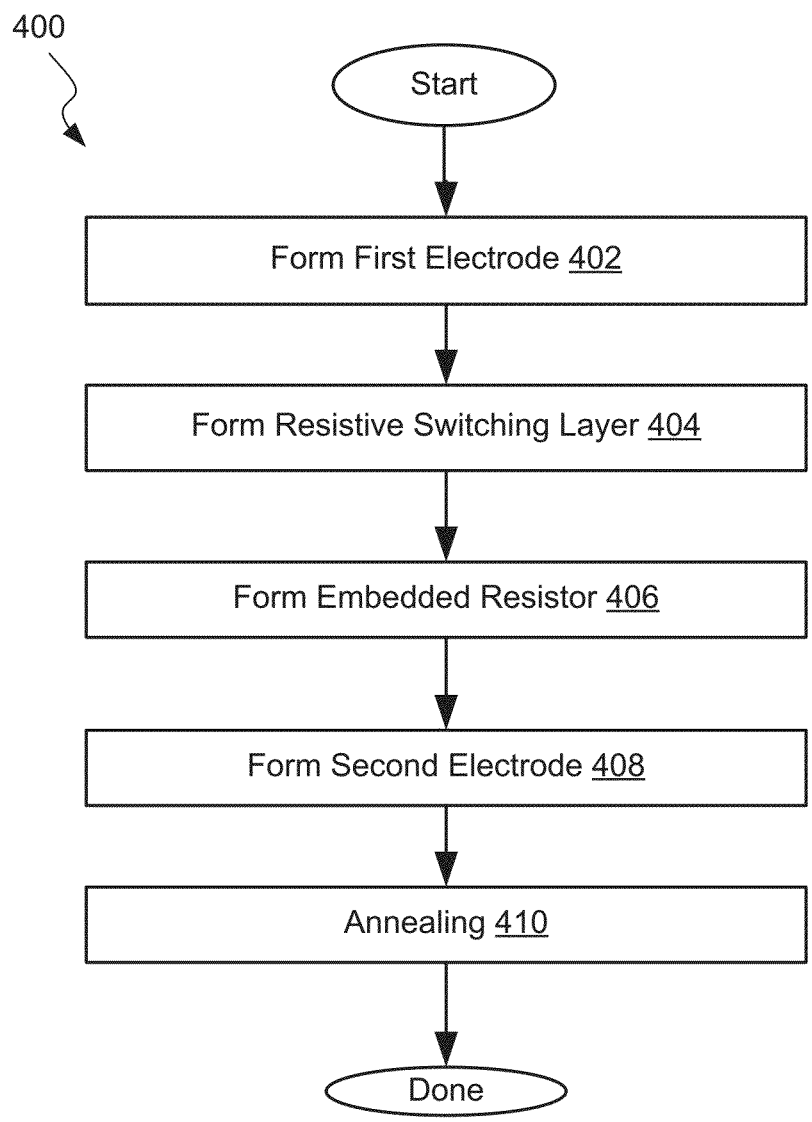
FIG. 4 illustrates a process flowchart corresponding to a method of fabricating a ReRAM cell including an embedded resistor, in accordance with some embodiments.

FIG. 4 illustrates a process flowchart corresponding to method 400 of fabricating a ReRAM cell, in accordance with some embodiments. Method 400 may commence with forming a first layer operable as a first electrode during operation 402. In some embodiments, the substrate may include a first electrode, in which case method 400 may proceed with forming nanolaminate structures of a resistive switching layer during operation 404. Alternatively, method 400 may proceed with forming a first electrode on the substrate during operation 402. For example, a titanium nitride electrode may be formed using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

Method 400 may proceed with forming a second layer over the first layer during operation 404. The second layer is operable to reversibly switch between two resistive states when a switching signal is applied to the memory cell. The second layer may be referred to as a resistive switching layer. Various examples of the resistive switching layers are described above with reference to FIGS. 3A and 3B.

Method 400 may proceed with forming a third layer over the second layer during operation 406. The third layer is operable as an embedded resistor. In some embodiments, the third layer is formed before the second layer, i.e., operation 406 is performed before operation 404. In this case, the second layer is formed over the third layer. More specifically, a resistive switching layer is formed over an embedded resistor. In some embodiments, the third layer directly interfaces the second layer. Alternatively, another layer may be disposed between the second layer and third layer. For example, an intermediate layer may be formed between the second layer and third layer. Various example of the third layer operable as an embedded resistor are described above with reference to FIGS. 3A and 3B.

In some embodiments, the third layer may be formed by atomic layer deposition (ALD). For example, ALD cycles depositing a nitride of the first metal may be combined with ALD cycles depositing a second metal or a nitride of the second metal. Alternatively, the third layer may be formed by physical vapor deposition (PVD), such reactive sputtering in a nitrogen containing environment. In general, a second metal may be introduced as dopant during deposition of the nitride of the first metal or after depositing the nitride of the first metal.

Method 400 may proceed with annealing at least the third layer during operation 410. In some embodiments, other layers may be present during operation 410. The annealing may be performed at a temperature of up to 750° C. for up to 60 seconds. The third layer remains substantially amorphous after annealing.

Memory Array Examples

Figure 5A:
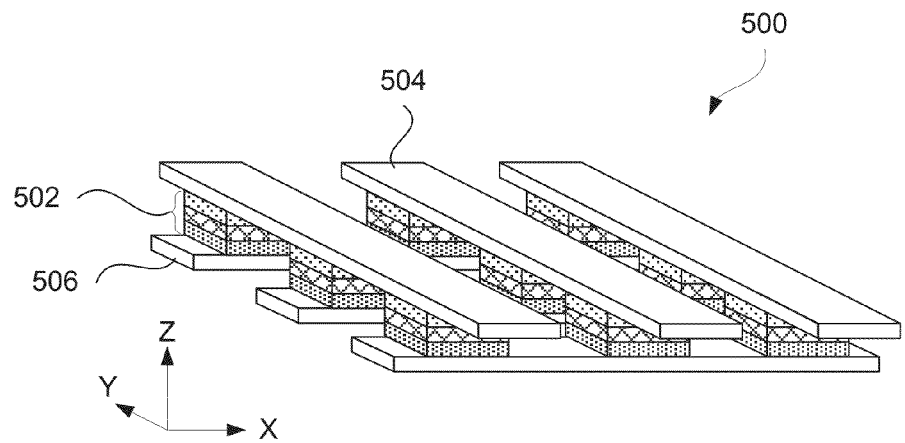
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
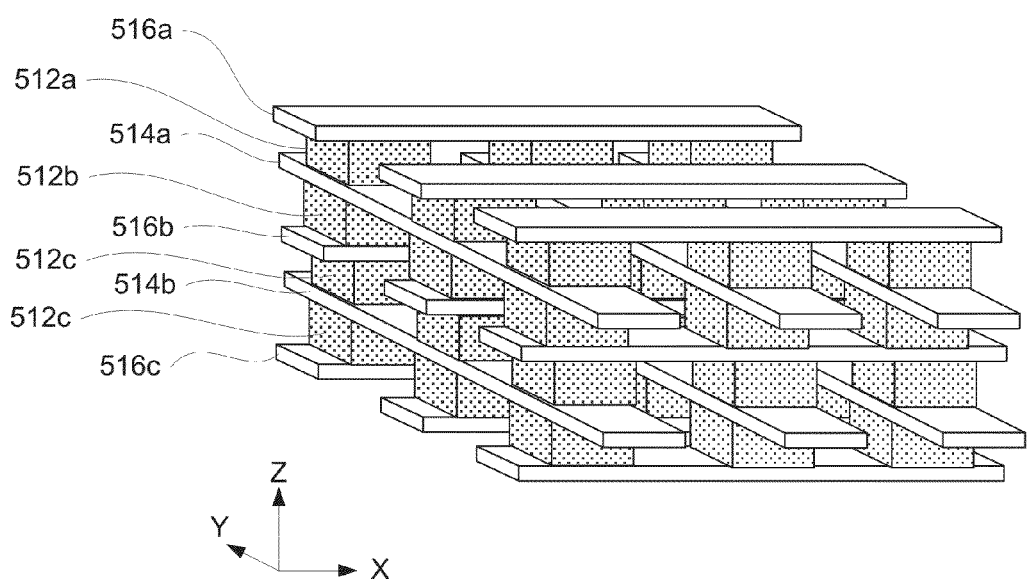

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:
1. A memory cell comprising:
a first layer operable as a first electrode;
a second layer operable to reversibly switch between two resistive states when a switching signal is applied to the memory cell;
a third layer connected in series with the second layer, and a fourth layer operable as a second electrode;
wherein the second layer and the third layer are disposed between the first layer and the fourth layer,
wherein the third layer has a resistivity of between 1 Ohm-cm and 4 Ohm-cm when a reading signal is applied to the memory cell,
wherein the third layer comprises a first stoichiometric nitride of a first metal,
wherein a bandgap of the stoichiometric nitride of the first metal is less than about 2 eV, and
wherein the third layer is doped with a second metal, wherein the second metal is different from the first metal.

2. The memory cell of claim 1, wherein the first metal is one of hafnium, zirconium, or titanium.

3. The memory cell of claim 1, wherein the second metal is one of tantalum, niobium, vanadium, tungsten, molybdenum, or chromium.

4. The memory cell of claim 1, wherein the third layer changes its resistivity by less than 200% when the switching signal is applied to the memory cell.

5. The memory cell of claim 1, wherein the third layer changes its resistivity by less than 100% when the switching signal is applied to the memory cell.

6. The memory cell of claim 1, wherein a thickness of the third layer is between about 20 Angstroms and 100 Angstroms.

7. The memory cell of claim 1, wherein the third layer further comprises a second stoichiometric nitride, wherein a bandgap of the second stoichiometric nitride is less than 2 eV.

8. The memory cell of claim 1, wherein the third layer further comprises a second stoichiometric nitride, wherein a bandgap of the second stoichiometric nitride is greater than 2 eV.

9. The memory cell of claim 8, wherein the second stoichiometric nitride is $Si_3N_4$.

10. The memory cell of claim 1, further comprising a fifth layer disposed between the second layer and the third layer, wherein the fifth layer is operable as an intermediate electrode.

11. The memory cell of claim 1, wherein the first stoichiometric nitride of the third layer is represented by a stoichiometric formula $M_3N_4$ in which M represents the first metal and N represents nitrogen.

12. The memory cell of claim 1, wherein the first stoichiometric nitride is $Hf_3N_4$.

13. The memory cell of claim 1, wherein the first stoichiometric nitride is $Zr_3N_4$.

14. The memory cell of claim 1, wherein the first stoichiometric nitride is $Ti_3N_4$.

15. The memory cell of claim 1, wherein the first stoichiometric nitride is formed by atomic layer deposition.

16. The memory cell of claim 1, wherein the first stoichiometric nitride is formed by physical vapor deposition.

17. The memory cell of claim 1, wherein a material of the third layer is amorphous.

18. The memory cell of claim 17, wherein the material of the third layer is configured to withstand a temperature of up to 750° C. for up to 60 seconds while remaining substantially amorphous.

19. The memory cell of claim 1, wherein the second metal forms a non-stoichiometric nitride of the second metal, and wherein the non-stoichiometric nitride forms a percolating network within a matrix of the stoichiometric oxide of the first metal within the third layer.

20. A method of fabricating a memory cell, the method comprising:
forming a first layer operable as a first electrode;
forming a second layer over the first layer;
forming a third layer over the second layer; and
forming a fourth layer over the third layer,
wherein the second layer is operable to reversibly switch between two resistive states when a switching signal is applied to the memory cell,
wherein the fourth layer is operable as a second electrode,
wherein the third has a resistivity of between 1 Ohm-cm and 4 Ohm-cm when a reading signal is applied to the memory cells, and
wherein the third layer comprises a stoichiometric nitride of a first metal,
wherein the stoichiometric nitride is represented by a stoichiometric formula $M_3N_4$ in which M represents the first metal and N represents nitrogen,
wherein a bandgap of the stoichiometric nitride of the first metal is less than 2 eV, and
wherein the third layer is doped with a second metal, wherein the second metal is different from the first metal.

* * * * *